US007429179B2

(12) United States Patent
Ma

(10) Patent No.: US 7,429,179 B2
(45) Date of Patent: Sep. 30, 2008

(54) CONTACT TERMINAL HAVING COMPLIANT CONTACT PORTION FOR USE WITH LAND ARRAY CONNECTOR TERMINAL

(75) Inventor: Hao-Yun Ma, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/725,701

(22) Filed: Mar. 19, 2007

(65) Prior Publication Data

US 2007/0218718 A1 Sep. 20, 2007

(51) Int. Cl.
*H01R 12/00* (2006.01)
*H05K 1/00* (2006.01)

(52) U.S. Cl. ........................................ 439/83; 439/862

(58) Field of Classification Search .................. 439/83, 439/71, 862
See application file for complete search history.

(56) References Cited

U.S. PATENT DOCUMENTS 6,565,368 B1 * 5/2003 Liao et al. ..................... 439/83

* cited by examiner

*Primary Examiner*—Javaid Nasri
(74) *Attorney, Agent, or Firm*—Wei Te Chung

(57) ABSTRACT

A conductive terminal (7) includes a right base portion (71), a connecting portion (72) extending from one side of the base portion (71), an elastic portion (72) extending from one side of the connecting portion (72), a securing portion (74) connecting with the base portion (71) and a solder portion (75) connecting to the printed circuit board. The elastic portion (73) comprises a contacting portion (731), the contacting portion (731) defines a compliant portion (7311) providing a surface-to-surface contact point with a conductive pad (81) of the chip module (8).

12 Claims, 5 Drawing Sheets

CONTACT TERMINAL HAVING COMPLIANT CONTACT PORTION FOR USE WITH LAND ARRAY CONNECTOR TERMINAL

FIELD OF THE INVENTION

The present invention relates to a terminal, and more particularly to a terminal for electrically connecting chip module to a printed circuit board.

DESCRIPTION OF RELATED ART

A conductive terminal 7 shown in FIGS. 1-2 comprises a base portion 71', a connecting portion 72' extending from the base portion 71', an elastic portion 73' extending upwardly and curved from an end of the connecting portion 72' and a securing portion 74' extending from an end of the base portion 71' and a solder portion 75' extending vertically from an end of the securing portion 74' for connecting with the printed circuit board, and a transitional portion 76' connecting the securing portion 74' and the solder portion 75'. The elastic portion 73' defines a contacting portion 731' for connecting with the chip module 8'.

In the terminal 7' abovementioned, the securing portion 74' is not coplanar with elastic portion 73'. In this case, the terminal 7' is easily twisted, when pressed downwardly. In addition, the contacting portion 731' of the terminal 7' only engages with a conductive pad of the chip module 8' with a point contact, referring to the FIG. 2 (a cross-sectional view of the contacting portion engaging with the chip module), hence the contacting portion 731' is easy to be worn away and the connection between the chip module 8' and the printed circuit board is not reliable.

Thus, there is a need to provide a new conductive terminal that overcomes the above-mentioned problem.

SUMMARY OF THE INVENTION

An object of the present invention is to provide a conductive terminal which can provide a reliable and stable connection between a chip module and printed circuit board.

In order to achieve above-mentioned object, a conductive terminal of the present invention includes a right base portion, a connecting portion extending from one side of the base portion, an elastic portion extending from one side of the connecting portion, a securing portion connecting with the base portion and a solder portion connecting to the printed circuit board. The elastic portion comprises a contacting portion, the contacting portion defines a slant surface for abutting against a conductive pad of the chip module.

Relative to the conventional terminal, the terminal defines a slant surface on the contacting portion. So when the terminal is pressed to distort, the slant surface can ensure a surface contact with the conductive pad of the chip module with the contacting portion distorted simultaneously which decreases abrasion due to the point contact between the contacting portion and the conductive pad and prolong the using life span of the terminal.

Other objects, advantages and novel features of the present invention will become more apparent from the following detailed description of the present embodiment when taken in conjunction with the accompanying drawings.

DETAILED DESCRIPTION OF THE INVENTION

Figure 1:
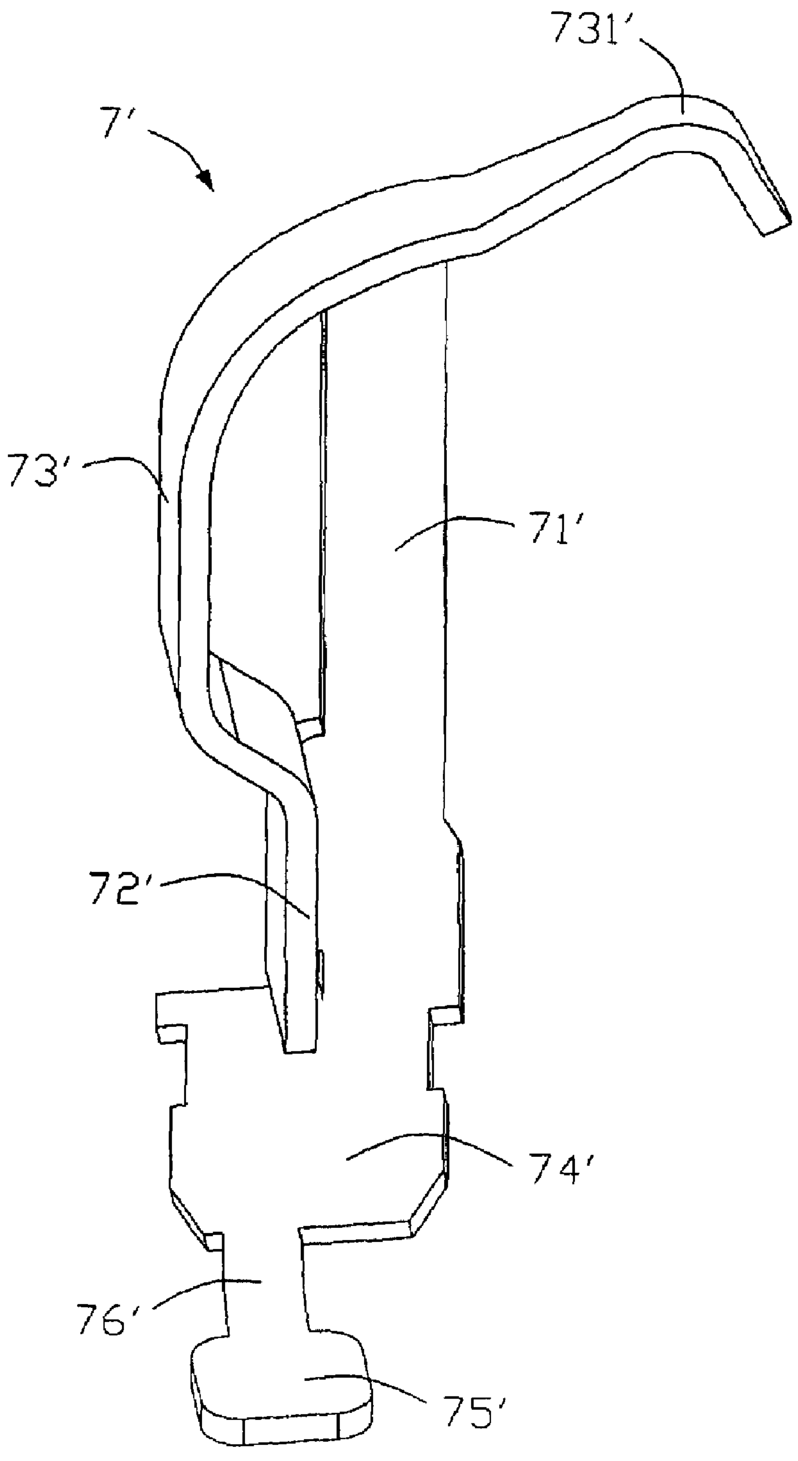
FIG. 1 PRIOR ART
FIG. 1 is an exploded perspective view of a conventional conductive terminal.
Figure 2:
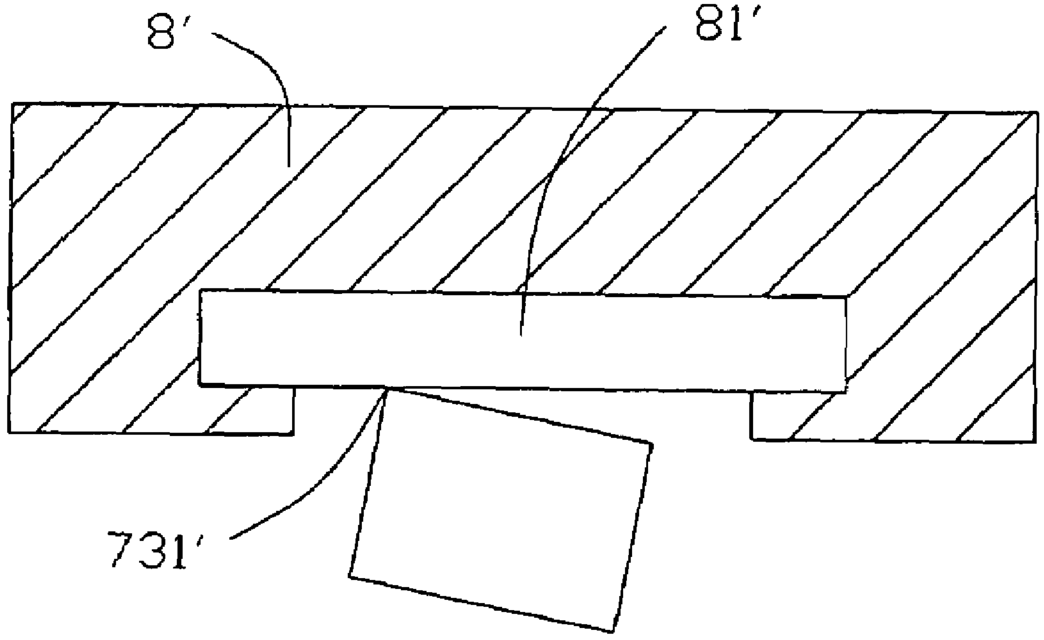
FIG. 2 PRIOR ART
FIG. 2 is a cross sectional view of the terminal shown in FIG. 1 engaged with the conductive pad of the chip module.

Reference will now be made to the drawing figures to describe the preferred embodiment of the present invention in detail.

Figure 3:
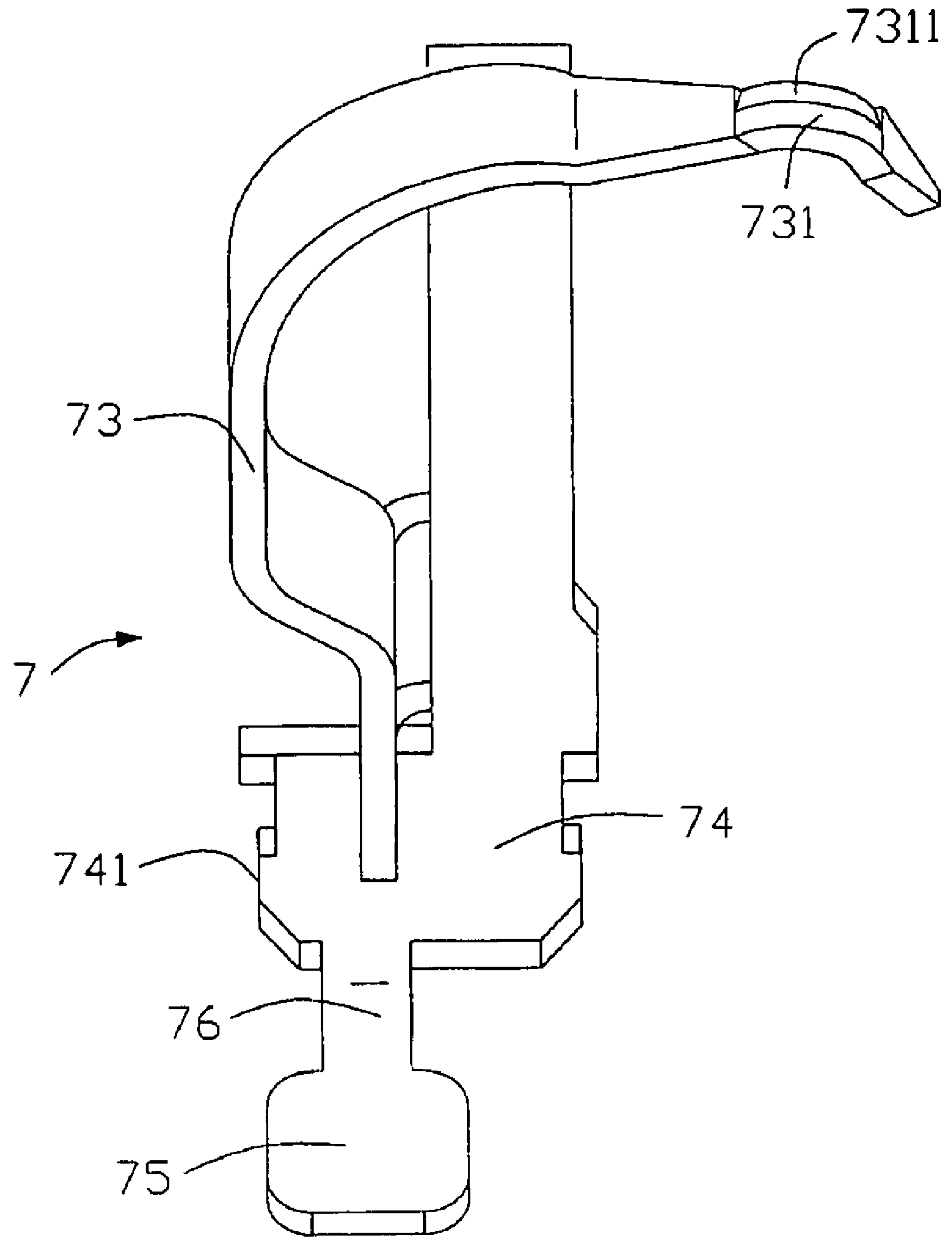
FIG. 3 is an exploded, isometric view of a terminal in accordance with the embodiment of the present invention.
Figure 4:
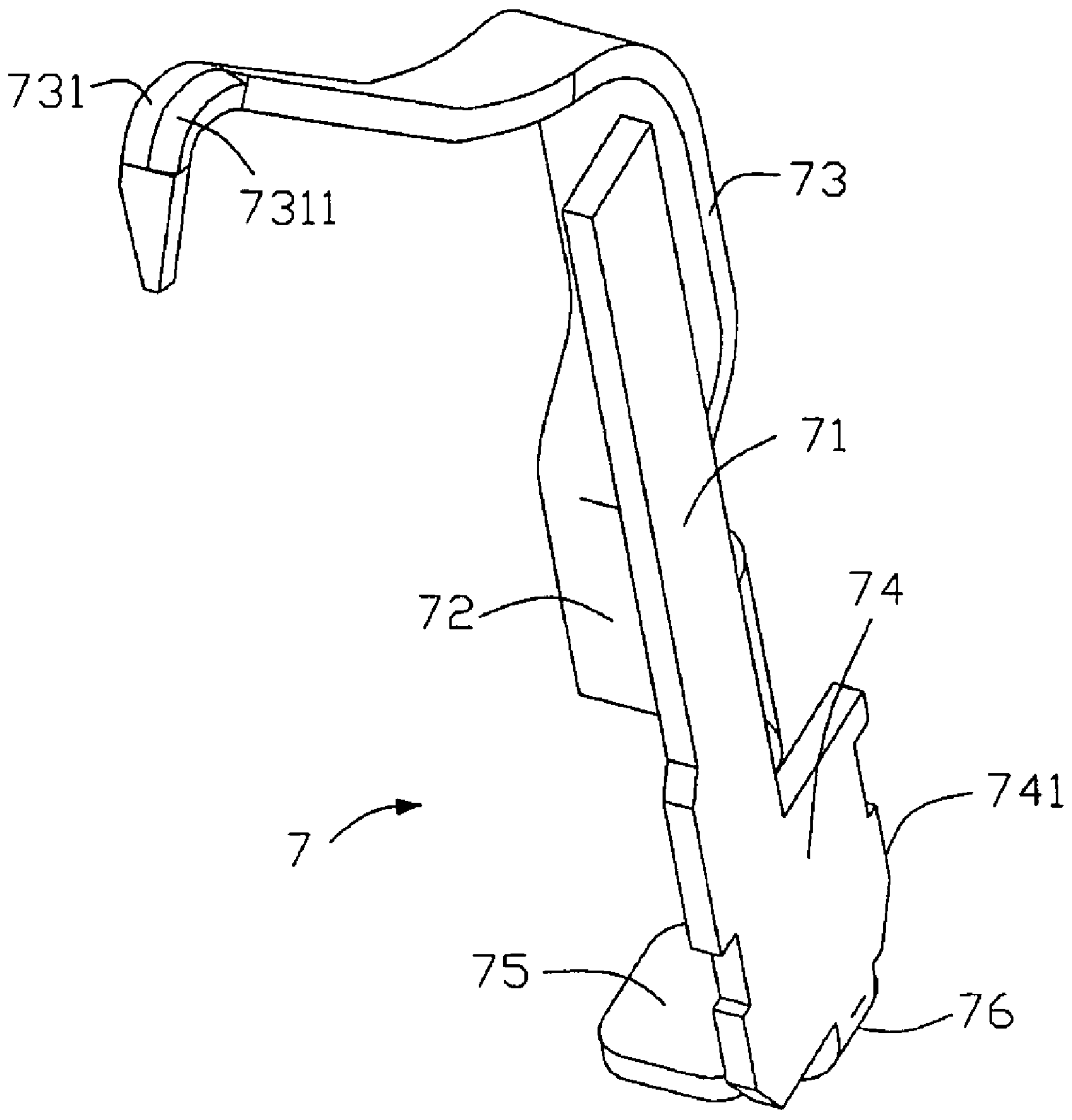
FIG. 4 is an another perspective view of the terminal shown in FIG. 3.
Figure 5:
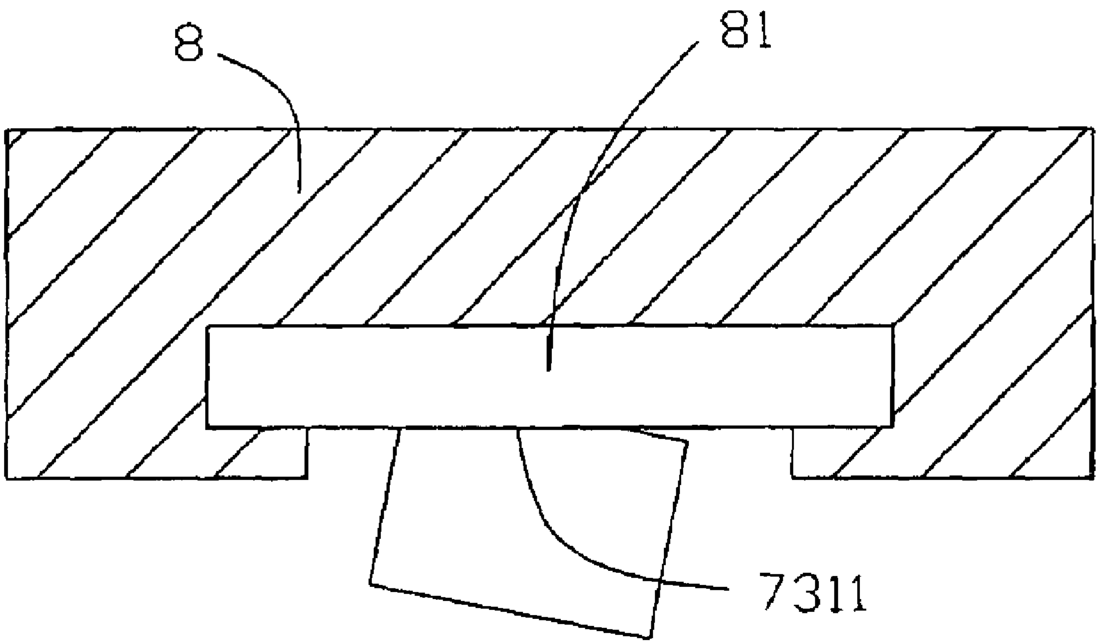
FIG. 5 is a cross sectional view of the terminal shown in FIG. 3 engaged with the conductive pad of the chip module.

Referring to FIGS. 3-5, a terminal 7 in accordance with the present invention includes a base portion 71 extending along a right direction, a connecting portion 72 extending vertically form a lateral side of the base portion 71, an elastic portion 73 extending upwardly from one side of the connecting portion 72, a securing portion 74 connecting with an end of the base portion 71, a solder portion 75 connecting to the printed circuit board.

The plate-like base portion 71 is located between the chip module 8 and the printed circuit board and extends along a right direction.

The connecting portion 72 is plate-like and extends vertically from a side of a lower end of the base portion 71.

The elastic portion 73 extends vertically from a free end of connecting portion 72 and bends backwardly, and comprises a smooth curved contacting portion 731 for contacting with the conductive pad 81 of the chip module 8. The contacting portion 731 comprises a first surface and a compliant portion 7311. The compliant portion 7311 is a second surface used to provide a surface-to-surface contact point with respect to a conductive pad of the chip module, the shape of which can be altered in line of the real situation.

The generally rectangular securing portion 74 extends vertically from a bottom end of the base portion 71 and coplanar with the base portion 71. In addition, width of the securing portion 71 is wider than that of the base portion, and the securing portion 74 defines a plurality of barbs 741 for engaging with a housing of an electrical connector.

The solder portion 75 is defined on a lower end of the securing portion 74 and extends along a horizontal direction, and the plane defined by the solder portion 75 is vertical to a plane defined by the securing portion 74. In addition, a transitional portion 76 forms between the solder portion 75 and the securing portion 74. The transitional portion 76 connects the securing portion 74 to the solder portion 75 with a smooth curved surface.

In the terminal 7 of the invention, the elastic portion 73 extends arcuately in the right direction. Said right surface is not coplanar with the surface defined by the securing portion 74. Said two surfaces are parallel with each other. In addition, the securing portion 74 is inserted into the passageways of the housing. Hence the elastic portion 73 is easily twisted when the terminal is pressed. Referring to FIGS. 4-5, the contacting portion 731 defines a compliant portion 7311. When the terminal 7 is twisted, the slant surface 7311 of the contacting portion 731 can be fittingly turned to engage with conducting pad 81 of the chip module 8. So the stability and the reliability between the terminal 7 and the chip module 8 can be ensured and the contacting portion 731 is contacting with the conducting pad 81 with a surface contact, which diminish the contacting force and decrease the abrasion of the terminal 7.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A conductive terminal comprising:

a base portion having a securing portion extending downwardly from a lower end of the base portion;

a solder portion extending from a lower end of the securing portion;

a connecting portion extending from a side of the base portion;

an elastic portion extending from a free end of the connecting portion;

wherein the elastic portion defines a contacting portion providing a compliant portion with a slant surface for providing a surface-to-surface contact point with respect to a conductive pad of the chip module if the elastic portion is twisted.

2. The terminal as in claimed claim 1, wherein the base portion is generally configured as a rectangular plate-like.

3. The terminal as claimed in claim 1, wherein the securing portion extends from an end of the base portion and is coplanar with the base portion.

4. The terminal as claimed in claim 1, wherein the width of the securing portion is wider than that of the base portion.

5. The terminal as claimed in claim 1, further comprising a transitional portion formed between the securing portion and the solder portion.

6. The terminal as claimed in claim 5, wherein a plane defined by the securing portion is vertical to plane defined the solder portion.

7. A terminal for use with an electronic pad of an electrical component, comprising:

a base portion;

a connecting portion extending from a side of the base portion;

an elastic portion extending from the connecting portion and defining a contacting portion providing a first contacting surface, and a second contacting surface oblique to the first contacting surface and sharing with first contacting surface a same common edge, wherein said second contacting surface is closer to the base portion than the first contacting surface and is adapted to be engaged with the electronic pad during mating with the electronic component if the elastic portion is twisted.

8. The terminal as claimed in claim 7, wherein said first contacting surface is adapted to be engaged with the electronic pad during mating with the electronic component if the elastic portion is untwisted.

9. The terminal as claimed in claim 7, wherein said base extends vertically.

10. A terminal for use with an electronic pad of an electrical component, comprising:

a base portion;

a connecting portion extending from a side of the base portion;

an elastic portion extending from the connecting portion and defining a contacting portion providing a first planar contacting surface, and a second planar contacting surface laterally beside and oblique to the first planar contacting surface, wherein said second planar contacting surface is closer to the base portion than the first planar contacting surface and is adapted to be engaged with the electronic pad during mating with the electronic component if the elastic portion is twisted.

11. The terminal as claimed in claim 10, wherein said first planar contacting surface is adapted to be engaged with the electronic pad during mating with the electronic component if the elastic portion is untwisted.

12. The terminal as claimed in claim 10, wherein said base extends vertically.

* * * * *